United States Patent [19]

Toyokura et al.

[11] Patent Number: 4,743,953
[45] Date of Patent: May 10, 1988

[54] RANDOM ACCESS MEMORY CELL WITH MIS CAPACITOR HAVING INSULATOR OF OXIDE OF DOPED METAL

[75] Inventors: Nobuo Toyokura, Kawasaki; Masao Taguchi, Sagamihara, both of Japan

[73] Assignee: Fujitsu Limited, Kawasaki, Japan

[21] Appl. No.: 894,509

[22] Filed: Aug. 6, 1986

Related U.S. Application Data

[63] Continuation of Ser. No. 713,588, Mar. 20, 1985, which is a continuation of Ser. No. 327,476, Dec. 4, 1981.

[30] Foreign Application Priority Data

Dec. 29, 1980 [JP] Japan ................... 55-189056

[51] Int. Cl.$^4$ ...................... H01L 29/78; H01L 29/34
[52] U.S. Cl. ................ 357/23.6; 357/23.11; 357/54
[58] Field of Search .......... 357/23.6, 23.11, 41, 357/54

[56] References Cited

U.S. PATENT DOCUMENTS

| 4,112,575 | 9/1978 | Fu et al. ................... 357/24 |
| 4,115,795 | 9/1978 | Masuoka et al. ........... 357/23 C |
| 4,151,607 | 4/1979 | Koyanagi et al. .......... 357/23.6 |
| 4,200,474 | 4/1980 | Morris ...................... 357/54 |
| 4,240,092 | 12/1980 | Kub ......................... 357/23 C |
| 4,250,206 | 2/1981 | Bate et al. ................ 357/54 |
| 4,343,657 | 8/1982 | Ito et al. .................. 357/23 C |
| 4,391,032 | 7/1983 | Schulte ..................... 357/23 C |

OTHER PUBLICATIONS

Patents Abstracts of Japan, vol. 4, No. 109(E-20) (591), 6th Aug. 1980, p. 18E20 & JP-A-55 65458 (Nippon Denki K.K.), 16-05-1980.
Patents Abstracts of Japan, vol. 2, No. 1, Dec. 26, 1977, p. 9395E77 & JP-A-52 113 181 (Hitachi Seisakusho K.K.), 22-09-1977.
European Search Report, Examiner A. Cardon, 7-7-1983, The Hague.

Primary Examiner—Gene M. Munson
Attorney, Agent, or Firm—Staas & Halsey

[57] ABSTRACT

A semiconductor device such as a MIS type capacitor which including a semiconductor substrate of one conductive sign (p-type silicon substrate), a region (n-type) of conductive sign opposite to that of the substrate formed in the substrate, an electrode making up a capacitor formed on the substrate apart from the region of opposite conductive sign and a transfer gate formed between the capacitor and the region of opposite conductive sign. The device is fabricated according to the invention such that the insulating film is formed under the electrode and has substantially the same planar form as the electrode, the insulating film contains impurities of a conductive sign opposite to that of the substrate and the region of opposite conductive sign is formed where the insulating film is in contact with the substrate. The region of opposite conductive sign is formed accurately in a self-alignment fashion. Such insulating film is made of an oxide or a nitride of at least one metal selected from the group consisting of Ta, Ti, Hf, Nb, Zr and Al.

9 Claims, 6 Drawing Sheets

RANDOM ACCESS MEMORY CELL WITH MIS CAPACITOR HAVING INSULATOR OF OXIDE OF DOPED METAL

This is a continuation of co-pending application Ser. No. 713,588, filed on Mar. 20, 1985, which is a continuation of Ser. No. 327,476, filed Dec. 4, 1981.

BACKGROUND OF THE INVENTION

This invention is directed to a semiconductor device such as a Metal-Insulator-Semiconductor (MIS) type capacitor, and more particularly to a one transistor type dynamic random access memory.

Currently, efforts are being made to increase integration density or elements per chip of semiconductor integrated circuits. In semiconductor devices thus far manufactured when maximizing integration density, it is necessary to reduce the area occupied by each element. However, with regard to the capacitor element of the memory cell, there is a limitation on the reduction in the size of the area it occupies because, as its area is reduced, electric charges that can be accumulated therein are also reduced.

Particularly in the case of a one transistor type memory cell which contains therein a capacitor element, reduction of the area of the capacitor element brings about lessening of the accumulated electric charges, namely the reduction of the magnitude of read signals, as well as lowering of the tolerance against noises from outside.

Against this background, attempts are being made to utilize, as an insulating film of the capacitor element explained above, a film made of dielectric material which has a higher dielectric constant than that of silicon dioxide being currently used extensively. This a move will make it possible to reduce the area occupied by the capacitor element without lessening overall accumulated electric charges through an increase of the capacitance per unit area.

Insulating film which possesses a higher dielectric constant than the silicon dioxide film may be found, for example, among the films made of silicon nitride ($Si_3N_4$), alumina ($Al_2O_3$), tantalum oxide ($Ta_2O_5$), titanium oxide ($TiO_2$) and the like. These insulating films, however, form surface states due to crystal defects or dangling bonds and capture electric charges as has never been experienced with the conventional silicon dioxide film. Furthermore, in addition to the surface states, charge capturing centers or traps are formed within the insulating film, the traps capture electric charges due to tunnel current from the surface and so forth.

Because of the surface states and the capturing of electric charges at traps, an inversion layer is formed at the surface of a silicon substrate as time goes by, so that electric charges accumulated by the capacitor element vary as time passes. Furthermore, electric charges trapped at capturing centers are not all discharged at the time of reading, reflecting the decrease in electric charges actually accumulated.

In preventing the decrease of accumulated electric charges due to the trapping of charges at capturing centers, an effective method has been found wherein impurities creating a region of a conductivity type opposite to that of a silicon substrate are diffused near the surface of the silicon substrate and under the insulating film of the capacitor element described above to form in advance an inversion layer. Further, formation of a region of a conductivity type which is opposite to that of the substrate under the insulating film of said capacitor element will turn the MIS type capacitor itself in to a depletion mode. In the conventional enhancement mode MIS capacitor, charging is effective only up to a voltage which is equal to the voltage applied to an upper electrode of the capacitor which is normally connected to a power source minus the threshold voltage under which an inversion layer is formed near that part of the substrate surface having the MIS structure providing the capacitance. The result obtained by the method described above is that it is possible to charge with the capacitor voltage of the power source, and this increases the number of electric charges accumulated at the capacitor.

One of the most difficult problems experienced in applying the above method of forming a region of a conductivity type opposite to that of the substrate near the survace of the substrate is the alignment of the region of opposite conductivity type and the upper electrode of the capacitor. In other words, where the capacitor electrode is extended to a region beyond the region having a conductivity type opposite to that of the substrate, there is created a gap in the semiconductor substrate between the transfer gate portion and the capacitor element where the channel is cut off, and the gap forms a potential barrier to the carriers which charge the capacitor. Because of this, there is either a voltage loss at the time of writing by the data line or, according to the circumstances, the data line and the capacitor element are not connected via the transfer gate portion. Both of these exert an adverse effect on the operation of the random access memory. Conversely, where there is a capacitor electrode inside the region of opposite conductivity type which extends under a part of the transfer gate, the effective length of the transfer gate portion is accordingly shortened, and the so-called short channel effect is caused, and the threshold voltage is lowered or, according to the circumstances, the data line and the capacitor element are connected by leakage current due to a punch through phenomenon, which deteriorates the memory retention characteristics considerably. This is also disadvantageous.

And thus, in forming the region of opposite conductivity type described above, an extremely high precision technique is required for the alignment of the capacitor element. However, even when an exposure is made by electron beams, misalignment on the order of ±0.2 μm cannot be avoided. Because of this, a substantial decrease in the manufacturing yield is presently being experienced.

Japanese Patent Publication (Unexamined) No. 59384 of 1978 published on May 29, 1978 discloses an invention titled: An N-channel MOS Silicon Gate RAM Cell. In that publication, there is disclosed an art of forming a region at the surface of a silicon substrate in such a manner that the region is to have a conductivity type which is opposite to that of the silicon substrate. Referring to FIG. 1 which shows in cross-section a part of a silicon substrate for fabricating the titled RAM cell, a p-type silicon substrate 1 is covered with a photoresist film 2 which has been patterned in a known manner. The photoresist film 2 is exposed to ultra violet light through a mask which shields a region covering where impurity ions are to be implanted. Ions of phosphorus are then driven into the region 3 where the RAM cell is to be fabricated at 150 KeV, with a dosage on order of $1 \times 10^{12}/cm^2$. And thus, region 4 of n-type is formed near the surface of the p-type silicon substrate covered with a film 5 of silicon dioxide. The publication does not teach, however, how the alignment is effected, nor does it disclose any use of insulating film made of a material other than silicon dioxide.

Japanese Patent Publication (Unexamined) No. 76687 of 1978 published on July 7, 1978 is for a patent application in which the invention of said application is titled: A Semiconductor Memory Device.

Referring to FIGS. 2 and 3, ions of phosphorus, with a dosage in order of $5 \times 10^{12}/cm^2$ are implanted into a p-type silicon substrate 11 or 11' near the surface of the substrate where a memory element is to be fabricated. As a result, an n-type region 14 or 14' is formed in the substrate 11 or 11' under a gate insulating film 12 or 12' of the memory capacitor on which is formed a capacitor electrode 13 or 13' of the memory capacitor. However, the publication does not teach how the alignment is done in this ion implantation, nor does it suggest any use of an insulating film other than a film made of silicon dioxide.

SUMMARY OF THE INVENTION

In view of the problems experienced in carrying out the known art described above, it is a general object of the present invention to offer an MIS type capacitor having improved characteristics by employing a novel process for the diffusion of impurities and a new insulating film.

In one embodiment of the invention, an insulating film comprising an oxide or a nitride of any one from the metals from the group of tantalum (Ta), titanium (Ti), hafnium (Hf), niobium (Nb), Zirconium (Zr), aluminum (Al) and the like is selected to provide the insulating film for the MIS capacitor. By utilizing such insulating film, it is possible to increase the number of accumulated electric charges considerably compared to the case where a conventional film of silicon dioxide is used. In other words, accumulation of the same quantity of electric charge may be realized in a much miniaturized region of the element, and this is effective in improving the integration density of the circuit.

In the embodiment of the invention, the metal oxide or nitride insulating film is doped with impurities of a conductivity type opposite to that of the silicon substrate on which the MIS capacitor is to be fabricated. When the film of the doped oxide or nitride of the metal is annealed, the grain size of the film becomes smaller, and this serves to lessen the leakage current.

Problems encountered in the prior art where an insulating film of high dielectric constant was employed are solved in the present invention by forming, near the surface of the semiconductor substrate, a region of a conductivity type opposite to that of said substrate through diffusion of impurities. By this process, it is possible to charge the capacitor up to the voltage applied to the upper electrode of the capacitor. This serves to increase the magnitude of the electric charge stored in the capacitor at the time of charging.

Further, in the present invention, alignment of the inversion region and the electrode of the capacitor which was heretofore difficult to realize is carried out by diffusion of impurities contained in the insulating film in a self-alignment fashion. Since such alignment is carried out precisely through a process which is much easier than the known process, the method of the present invention serves to improve the yield in the manufacture of MIS capacitors.

BRIEF DESCRIPTION OF THE DRAWINGS

In the drawings wherein like parts are marked alike.

DESCRIPTION OF THE PREFERRED EMBODIMENT

Reference will first be made to FIGS. 4 to 7 each of which shows in cross-section a part of a semiconductor substrate at various stages in the process of manufacturing an MIS capacitor according to the invention.

Figure 1:
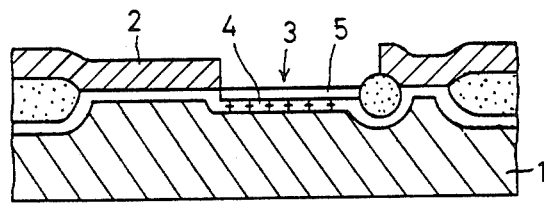
FIG. 1 is a cross-sectional view showing a part of a silicon substrate where an RAM cell is to be fabricated.
Figure 2:
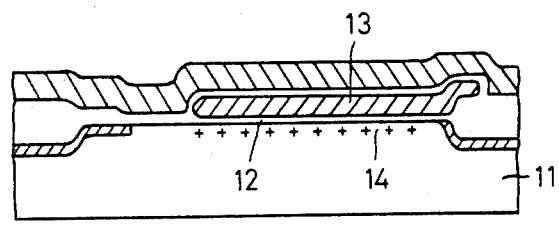
FIGS. 2 and 3 are cross-sectional views each of which show a part of a silicon substrate where a semiconductor memory device is to be fabricated.
Figure 3:
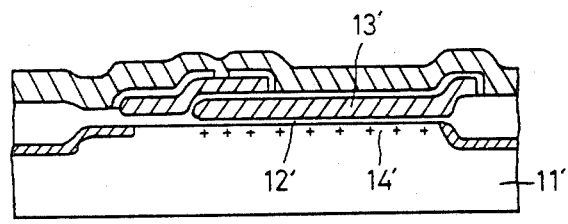
Figure 4:
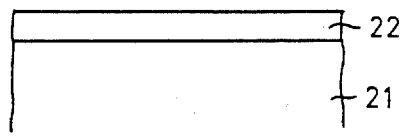
FIGS. 4 to 8 are cross-sectional views each of which shows a part of a silicon substrate at various stages of the process for manufacturing an MIS type capacitor according to the method of the invention.

On the surface of a silicon substrate 21 of p-type conductivity, for example, tantalum is deposited, in an atmosphere containing phosphine ($PH_3$) gas by a conventional double-pole sputtering method. In this process, tantalum film 22 containing phosphorus is grown 150 to 250 Å thick as shown in FIG. 4 on the silicon substrate 21.

Figure 5:
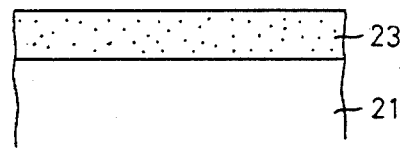

The tantalum film 22 is thoroughly oxidized in an atmosphere containing oxygen ($O_2$) at temperature on order of 500° to 700° C., and is converted to an oxidized film 23 comprising tantalum oxide ($Ta_2O_5$), 300 to 500 Å thick. Since oxidation in this process is carried out at comparatively low temperature, phosphorus contained in the film 23 of tantalum oxide is not diffused into the silicon substrate 21. Nor is the surface of silicon substrate 21 oxidized, and this state is illustrated in FIG. 5.

So far, the process of oxidizing the tantalum film 22 has been described with reference to FIG. 4. In another embodiment of the invention, however, it is also possible to grow directly on the silicon substrate 21 tantalum oxide film 23 by adding oxygen to the atmosphere mentioned before in the sputtering process described with reference to FIG. 4.

Figure 6:
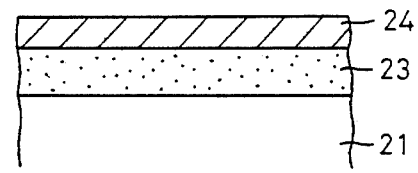

Next, to form an electrode of the MIS capacitor, a film 24 of molybdenum silicide ($MoSi_x$) is grown approximately 3000 Å thick by the conventional double-pole sputtering method as shown in FIG. 6. The electrode material is not limited to molybdenum silicide, but other materials, such as polycrystalline silicon that is, capable of withstanding a subsequent process of diffusing impurities at temperature above 900° C. may also be used according to the invention.

Figure 7:
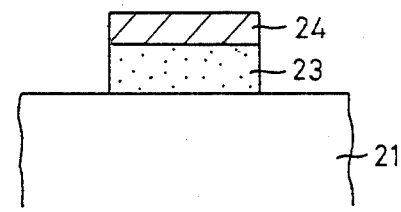

The tantalum oxide film 23 and molybdenum silicide film 24 are patterned by a conventional process to provide a capacitor element of predetermined shape as illustrated in FIG. 7. This may be selectively done with only one mask by reactive sputtering etching using carbon tetrafluoride ($CF_4$) gas and trifluoromethane ($CHF_3$) gas alternately.

Figure 8:
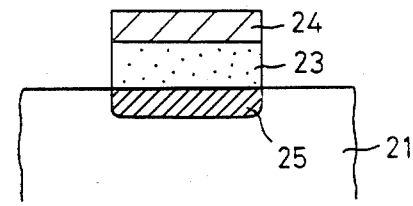

Thereafter, a heat treatment is carried out for 30 minutes at temperature of 1000° C. to form a region 25 of n-type conductivity by diffusing phosphorus contained in the film 23 of tantalum oxide at the surface of the silicon substrate 21 as illustrated in FIG. 8.

Figure 9:
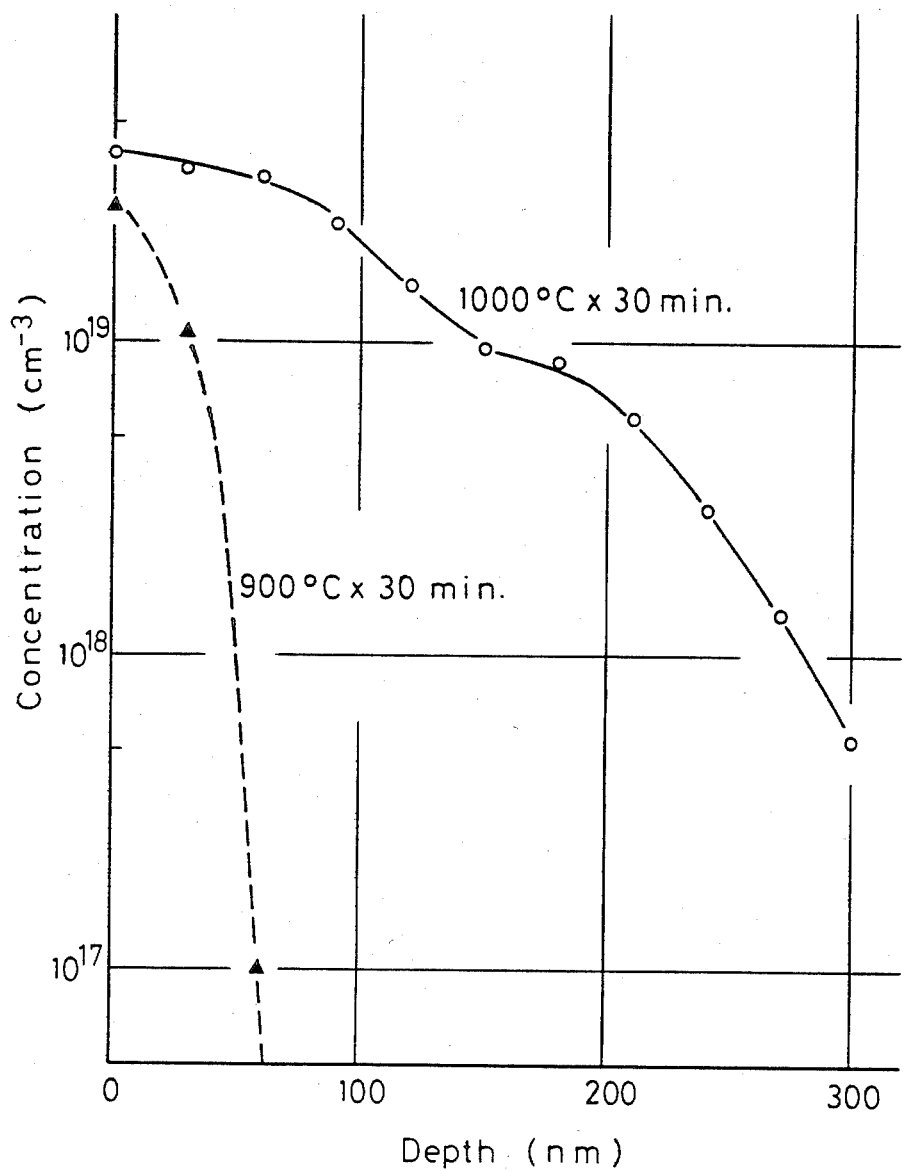
FIGS. 9 and 10 are diagrams showing the result of annealing according to the present invention.

Reference will now be made to FIG. 9 which illustrates the diffusion path (in nm) and the concentration (per cm$^3$) obtained by the heat treatment just described. It will be noted that by the heat treatment at 1000° C. for 30 minutes, impurities are sufficiently introduced to attain the object of the invention.

As will be understood from the foregoing description, a metal selected from a group consisting of Ta, Ti, Hf, Nb, Zr, Al or the like is oxidized in the embodiment of the invention, and during the step of forming an insulating film of high dielectric constant, impurities contained in the film are not yet diffused into the substrate. The impurities are only diffused when a subsequent heat treatment is carried out at a higher temperature. This is one feature of the invention.

Figure 10:
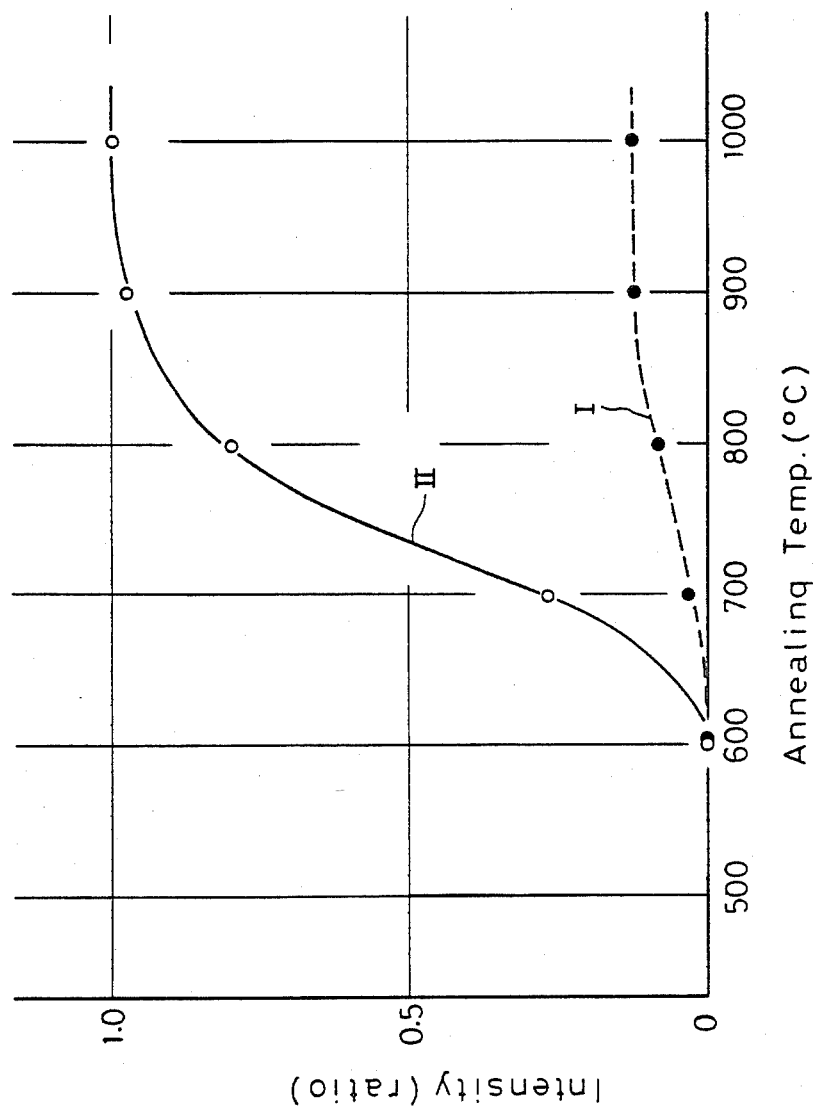
Figure 11:
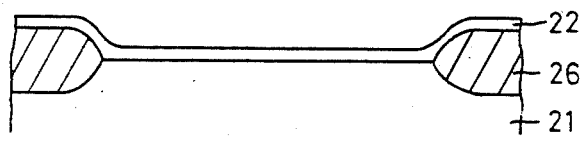
FIGS. 11 to 19 are cross-sectional views each of which shows a part of a silicon substrate at various stages of the process for manufacturing a one transistor type dynamic random access memory according to the method of the present invention.

It was found that when phosphorus doped $Ta_2O_5$ film 23 is heat treated, the grain size is made smaller, helping to reduce the leakage current. This was confirmed by experiments the results of which is shown in FIG. 10.

Both phosphorus doped and non-doped $Ta_2O_5$ were heat treated in oxygen atmosphere for 30 minutes. Then, using an X-ray diffractometer, X-ray diffraction was measured both either samples. In FIG. 10, intensity of diffraction was counted by the counter of the X-ray diffractometer. In the diagram of FIG. 10, curve I represents data of phosphorus doped $Ta_2O_5$, curve II those of non-doped $Ta_2O_5$. The fact that curve I shows a lower intensity of X-ray diffraction than that of curve II indicates that, since grain size of doped $Ta_2O_5$ is smaller than that of non-doped $Ta_2O_5$, an X-ray is diffracted less from the former than that from the latter.

By virtue of the subsequent heat teatment mentioned above, it is possible to form, in a region where the MIS capacitor is to be fabricated, a region of a conductivity type opposite to that of the substrate having an accurate alignment. In the described embodiment, a process of forming an insulating film is for an oxide. However, the scope of the invention is not limited thereto, and a nitride formed in nitrogen atmosphere may also be used.

Reference will next be made to FIGS. 11 to 19 each of which shows in cross-section a part of the silicon substrate at various stage in the manufacture of a one transistor type dynamic random access memory cell in which the embodiment of the invention is especially effective.

A sufficiently thick oxide film 26, the so-called field oxide film is formed on a p-type silicon substrate 21 by a conventional selective oxidation process. Next, tantalum film 22 containing phosphorus is grown 180 Å thick on the entire surface of the substrate by the same process explained before by reference to FIG. 4. Phosphorus may be included in the film by either a reactive sputtering in $PH_3$ gas or double-pole sputtering using metallic phosphorus and tantalum.

Figure 12:
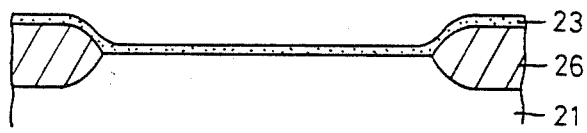

Then, in an oxygen atmosphere, heat treatment is carried out at 500° C. for approximately 20 minutes, thoroughly the oxidizing tantalum film 22 to turn it to $Ta_2O_5$ film 23. Under this temperature condition, phosphorus is not diffused into the silicon substrate 21, but remains in $Ta_2O_5$ film 23, the concentration being on the order of $1 \times 10^{18}$ to $1 \times 10^{22}$ cm$^{-3}$, for example as illustrated in FIG. 12.

Figure 13:

After these processes, MoSix film 24, for example, is grown approximately 3000 Å thick by the known sputtering process as shown in FIG. 13.

Figure 14:
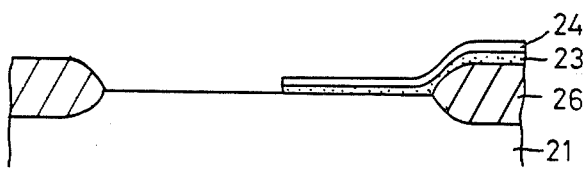

Next, $Ta_2O_5$ film 23 and MoSix film 24 are patterned in a known manner that these films remain in a predetermined region where the capacitor element is to be fabricated (FIG. 14).

Figure 15:
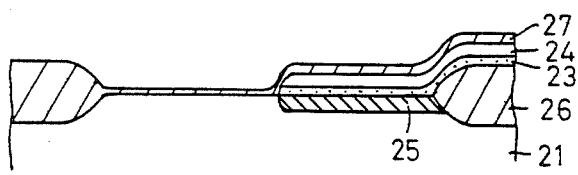

On the structure shown in FIG. 14, a gate insulation film of the transfer gate portion is formed at a region where the surface of the silicon substrate 21 is exposed. The entire surface of the substrate 21 is then oxidized in oxygen atmosphere, at 950° C. for 30 minutes to make silicon dioxide film 25 approximately 500 Å thick. By virtue of this process, a silicon dioxide film 27 is formed not only on the surface of silicon substrate 21 and field oxide film 26 but also on the surface and the side of MoSix film 24. Thus, the MoSix film 24 which is to be an upper electrode of the MIS capacitor portion is completely isolated from its surroundings. Further, because of this heat treatment at high temperature, part of the phosphorus in the $Ta_2O_5$ film 23 is diffused, in a self-alignment fashion, into the surface of silicon substrate 21, and n-type region 25 having a phosphorus concentration on the order of $5 \times 10^{10}$ to $2 \times 10^{15}$ cm$^{-2}$ is formed only in that part of silicon substrate 21 which is in contact with the $Ta_2O_5$ film 23 as illustrated in FIG. 15. Thus, alignment of the capacitor electrode and the inversion layer which was not feasible in the prior art can be realized with precision.

Figure 16:
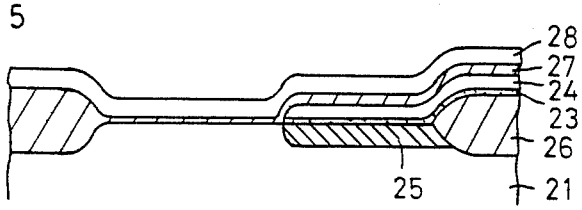
Figure 17:
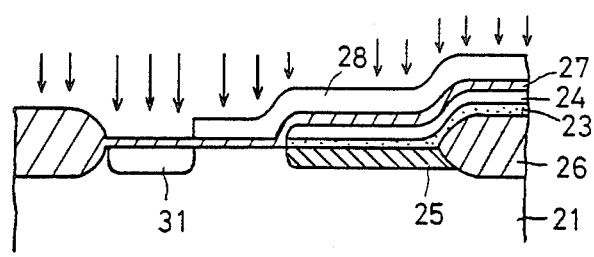

Then, to form an electrode of the transfer gate portion, polycrystalline silicon film 28 is grown approximately 5000 Å thick on $SiO_2$ film 27 as shown in FIG. 16. The polycrystalline silicon film 28 is next patterned according to a predetermined shape and partly removed. Ions of arsenic (As) are then implanted into the entire surface of the silicon substrate by the conventional ion implantation process at 50 KeV, with a dosage on the order of $1 \times 10^{15}$ cm$^{-2}$. A heat treatment is carried out thereafter to form a data line portion 31. The ions of arsenic thus implanted are diffused by the above-described heat treatment to form the data line portion 31 besides forming donors in the polycrystalline silicon film 28 which helps to improve conductivity of the film functioning as an electrode of the transfer gate portion (FIG. 17).

Figure 18:
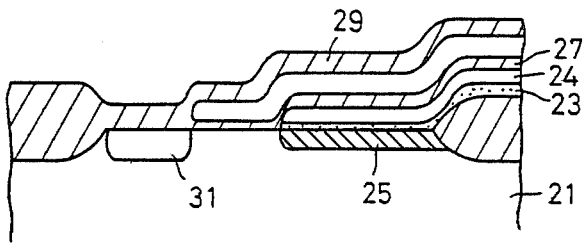

Thereafter, phosphorus containing PSG (phosphosilicate-glass) film 29, approximately 0.8 μm thick is formed on n$^+$-type diffusion layer 31 and the electrode 27 of the transfer gate portion as illustrated in FIG. 18.

Figure 19:
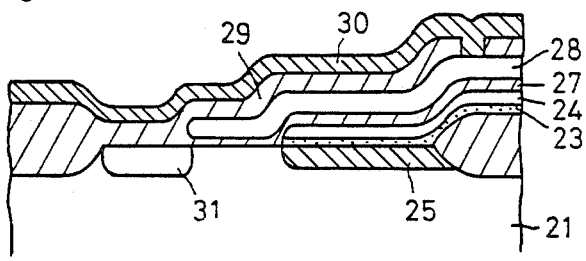

After selectively removing the PSG film 29 at predetermined regions, aluminum film is grown approximately 1.0 μm thick by the conventional sputtering process. The aluminum film is further processed to provided word line 30 and other wirings (FIG. 19).

In each embodiment of the invention, tantalum alone was selected and illustrated as a metal to be used in forming an insulating film for the capacitor element as has been described so far. It is also possible to form an insulating films of high dielectric constant such as the film of titanium oxide, hafnium oxide, niobium oxide, zirconium oxide, alumina, etc. by using metals such as Ti, Hf, Nb, Zr, Al and so forth, and still secure the same effect as has been described.

An insulating film containing any one of the above-listed metals may have a lower withstanding voltage when it is subjected subsequently to heat treatment at high temperatures repeatedly. In order to overcome this problem, insulating films containing one of the listed metals may be piled in multiple layers, or a thin film of silicon nitride ($Si_3N_4$) may be deposited on the insulating film already formed to provide a device having improved characteristics.

Phosphorus is not the only impurity material to be included in the insulating film. Other materials may also be included in the gaseous atmosphere; for example, arsenic, which can be easily introduced into the insulating film may also be used in carrying out the method of the invention.

As has been described above, a region of a conductivity type opposite to that of a semiconductor substrate on which an MIS capacitor element is to be fabricated is formed in precise alignment in a device according to the present invention. An insulating film for the capacitor element is formed by a metal oxide such as $Ta_2O_5$ as compared to $SiO_2$ film according to the prior art. The insulating film according to the invention has a higher dielectric constant which serves the purpose of minimizing the area to be occupied by the capacitor element. The insulating film is doped with an impurity material, and because of this, the grain size is made smaller than when the insulating film is not so doped. This helps to minimize the leakage current.

All of these features make it possible to enhance the function density of the MIS type capacitors according to the invention besides improving characteristics of the capacitors.

Thus, the invention having been described in its best embodiment and mode of operation, that which is desired to be protected by Letters Patent is:

We claim:

1. A semiconductor device, comprising:
   a substrate of one conductivity type;
   a first region formed in said substrate of a conductivity type opposite to that of said substrate;
   an electrode comprising a capacitor formed over said substrate at a position apart from said first region; and
   a transfer gate formed between said capacitor and said first region of opposite conductivity type;
   wherein said capacitor comprises:
      an insulating film formed under said electrode in substantially the same planar shape as said electrode, said insulating film comprising an oxide of a doped metal selected from a group of metals comprising tantalum, titanium, zirconium and hafnium, containing dopant impurities of a conductivity type opposite to that of said substrate, and having a reduced grain size of the metal oxide as compared to the metal oxide doped after oxidation; and
      a second region of said opposite conductivity type formed in said substrate where said insulating film is in contact with said substrate.

2. A semiconductor device of claim 1, wherein said second region and said electrode are self-aligned by heat treating said insulating film first at a temperature within the range of 500° to 700° C. when forming the oxide, and then at approximately 1000° C. to form said second region of opposite conductivity type.

3. A semiconductor device of claim 1, wherein said insulating film is patterned and said second region of opposite conductivity type is formed self-aligned when the heat treatment is carried out after patterning of said insulating film.

4. A semiconductor device, comprising:
   a substrate of a first conductivity;
   a first layer formed on said substrate and comprising an oxide of a doped metal and having a reduced grain size of the metal oxide as compared to the metal oxide doped after oxidation;
   a second layer formed over said first layer and comprising a material capable of withstanding a diffusion process of at least 900° C.; and
   a region of a second conductivity opposite to the first conductivity formed in said substrate by diffusion of the impurity in said first layer into said substrate.

5. A semiconductor device of claim 4, wherein the impurity is selected from the group consisting of phosphorous and arsenic.

6. A semiconductor device of claim 5, wherein the material capable of withstanding a diffusion process of at least 900° C. is selected from the group consisting of molybdenum silicide and polycrystalline silicon.

7. A semiconductor device of claim 6, wherein said first layer comprises a plurality of said first layers.

8. A semiconductor device of claim 6, further comprising a silicon nitride layer formed between said first and second layers.

9. A semiconductor device of claim 7 or 8, further comprising:
   a first insulating layer formed on said second layer;
   a transfer gate formed on said insulating layer;
   a data line formed in said substrate;
   a second insulating layer formed on said transfer gate and said data line; and
   a conductor formed on said second insulating layer and in contact with said transfer gate.

* * * * *